(12) United States Patent
Schatzberger

(10) Patent No.: US 8,198,947 B2
(45) Date of Patent: Jun. 12, 2012

(54) OSCILLATOR CIRCUIT AND METHOD FOR GENERATING A CLOCK SIGNAL

(75) Inventor: Gregor Schatzberger, Graz (AT)

(73) Assignee: austriamicrosystems AG, Unterpremstätten (AT)

( * ) Notice: Subject to any disclaimer, the term of this patent is extended or adjusted under 35 U.S.C. 154(b) by 93 days.

(21) Appl. No.: 12/828,180

(22) Filed: Jun. 30, 2010

(65) Prior Publication Data
US 2010/0327985 A1    Dec. 30, 2010

(30) Foreign Application Priority Data

Jun. 30, 2009 (DE) .......................... 10 2009 031 144

(51) Int. Cl.
*H03K 3/26* (2006.01)
(52) U.S. Cl. .................... 331/111; 331/143; 331/176
(58) Field of Classification Search .................. 331/111, 331/143, 176
See application file for complete search history.

(56) References Cited

U.S. PATENT DOCUMENTS

| | | | |
|---|---|---|---|
| 5,912,593 A | 6/1999 | Susak et al. | |
| 6,356,161 B1 | 3/2002 | Nolan et al. | |
| 6,646,513 B1 | 11/2003 | Neidorff | |
| 7,474,163 B1 | 1/2009 | Wile et al. | |
| 7,944,315 B2* | 5/2011 | Lin | 331/44 |
| 2007/0182495 A1 | 8/2007 | Lall | |

\* cited by examiner

*Primary Examiner* — Arnold Kinkead
(74) *Attorney, Agent, or Firm* — Cozen O'Connor

(57) ABSTRACT

An oscillator circuit comprises a charging block with a first terminal for feeding a first charging current, to which terminal a first capacitor and a series circuit of a first and a second switch are connected, and with a second terminal for feeding a second charging current, to which terminal a second capacitor and a series circuit of a third and a fourth switch are connected, as well as a comparison circuit with a first and a second comparator. The comparators are configured to compare voltages at the first and second terminals to a reference voltage, wherein their output is connected to control terminals of the third or first switch. The oscillator circuit further comprises a flipflop that is coupled on the input side to the outputs of the first and second comparators, and on the output side, to control terminals of the second and fourth switches, as well as to an oscillator output.

15 Claims, 7 Drawing Sheets

OSCILLATOR CIRCUIT AND METHOD FOR GENERATING A CLOCK SIGNAL

RELATED APPLICATIONS

This application claims the priority of German application no. 10 2009 031 144.0 filed Jun. 30, 2009, the entire content of which is hereby incorporated by reference.

FIELD OF THE INVENTION

The invention relates to an oscillator circuit and a method for generating a clock signal.

BACKGROUND OF THE INVENTION

Oscillators or clock generators can be realized with various types of circuit technology. High accuracies can be achieved with quartz oscillators, but such quartz oscillators require an external component, namely the quartz, which increases the production cost of integrated circuits. In addition, appropriate quartz oscillators are usually only specified up to a maximum temperature of 125° C.

In another conventional manner of implementing an oscillator, two capacitors are alternately charged with a defined charge current up to a defined reference voltage. The charge voltage of the capacitor is compared with respective comparators, with the output signal of the comparator changing a state of a flipflop. This output state of the flipflop then ends the charging process of the one capacitor and starts the charging process of the other capacitor, until it too has reached the reference voltage. The output signal of the flipflop serves as the clock signal to be generated.

A frequency, or a period duration of the clock signal, results from the time duration of the charging process until the reference voltage is reached, wherein the switching time of the comparators when the reference potential is exceeded by the charge voltage also has to be taken into consideration.

The switching times of the comparators are typically strongly dependent on the temperature. If, in addition, the proportion of the comparator switching time in the period duration of the clock signal is high, this results in a temperature-dependence of the entire period duration, and thus of the oscillator frequency.

SUMMARY OF THE INVENTION

It is, therefore, an object of the invention to provide an oscillator and a method for generating a clock signal that operate with improved temperature-independence.

In one embodiment, an oscillator circuit comprises a charging block with a first terminal for feeding a first charging current and with a second terminal for feeding a second charging current. A first capacitor and a series circuit of a first and a second switch are connected to the first terminal. A second capacitor and a series circuit of a third and a fourth switch are connected to the second terminal. The oscillator circuit further comprises a comparison circuit with a first and a second comparator. The first comparator, whose output is connected to a control terminal of the third switch, is configured to compare a voltage at the first terminal to a reference voltage. In a similar manner, the second comparator, whose output is connected to a control terminal of the first switch, is configured to compare a voltage at the second terminal to the reference voltage. A flipflop is coupled on the input side to the outputs of the first and second comparators, and on the output side, to control terminals of the second and fourth switches, as well as to an oscillator output.

It is fundamental that the first and second capacitors be alternately charged in such an oscillator circuit, with overlaps of the charging processes occurring. The overlapping is possible due to the separate charging currents. For example, if the charge voltage of the first capacitor, i.e., the voltage at the first terminal, exceeds the value of the reference voltage, the third switch is opened, so that the second charging current, which is supplied to the second terminal, charges the second capacitor, since an outflow via the third switch is no longer possible. At the same time, the changing output signal of the first comparator triggers the flipflop in such a manner that its output state changes. Due to the changed output state, the second switch is switched to a closed state and the fourth switch to an open state.

Since the charge voltage of the second capacitor is still lower at this point in time than the reference voltage, the first switch is likewise in a closed state due to the output signal of the second comparator. Since the first and the second switches are consequently closed, the first charging current no longer flows into the first capacitor due to the lower resistance of the closed switches, so that the charging process of the first capacitor has been ended. The first capacitor simultaneously discharges via the first and second switches.

Since the charge voltage of the first capacitor is again lower thereafter than the reference voltage, the third switch is again closed by the first comparator. At this point in time, however, the fourth switch is opened, so that the second charge current continues to charge the second capacitor. If the voltage across the second capacitor exceeds the reference voltage, then processes comparable to those just described take place.

Accordingly, the first switch is opened by the second comparator, so that a charging process of the first capacitor by the first charging current is, started. The output state of the flipflop is additionally changed so that the fourth switch is closed and the second switch opened. Because the third and fourth switches are now closed, the second capacitor is discharged and the second charging current is diverted. The changed charge voltage of the second capacitor causes the first switch to be closed again by the second comparator, wherein the charging current continues to charge the first capacitor due to the opened second switch.

The output state of the flipflop simultaneously represents the generated clock signal.

In one embodiment, the first capacitor and the series circuit of the first and second switches are connected in parallel, for example, between the first terminal and a reference potential terminal. Correspondingly, the second capacitor and the series circuit of the third and fourth switches are connected in parallel, for example, between the second terminal and a reference potential terminal. Because the charging process of the one capacitor is already beginning when the charge voltage of the respective other capacitor has exceeded the reference voltage, but the clock signal corresponds to the output state of the subsequently switching flipflop, the switching times of the comparators in relation to the period duration of the clock signal to be generated have no effect. Accordingly, the clock frequency of the clock signal remains constant, even in case of temperature-dependently changed switching times of the comparators. Thereby the oscillator circuit has a lower temperature dependency.

In one embodiment, the oscillator circuit comprises a current generation circuit that is configured to generate the first and second charging currents from a temperature-compensated reference current. Accordingly, the first and second charging currents are substantially independent of the operating temperature or ambient temperature of the circuit.

In one refinement, the oscillator circuit further comprises a bandgap circuit that is configured to generate the reference voltage and to generate the temperature-compensated reference current. A bandgap circuit can also be referred to as an energy-gap circuit.

For example, the bandgap circuit is configured to generate a bandgap voltage by means of a current with positive temperature coefficients and to generate the temperature-compensated reference current with the current having a positive temperature coefficient and a current with a negative temperature coefficient. Consequently, the reference current, the first and second charging currents, as well as a reference voltage generated from the bandgap voltage, all have the same temperature behavior, so that the effects of a changing charging current are cancelled by the effects of an identically changing reference voltage. It must be noted here that the temperature-compensated reference current is nearly temperature-independent in any case, because of the currents with different temperature coefficients. A bandgap voltage of the above-cited type is known to be likewise subject to only slight temperature influences.

In one embodiment of the oscillator circuit, the bandgap circuit is configured to generate the reference voltage with a value smaller than that of the bandgap voltage. Thereby shorter charging times of the capacitors and thus higher frequencies of the clock signal can be achieved.

In one embodiment of the oscillator circuit, the current generation circuit is further configured to generate a bias current from the temperature-compensated reference current, the bias current being provided for use in the comparison circuit. For example, the bias current is used to adjust the operating point in the comparators, in particular, to adjust defined output potentials. The temperature-independence of the oscillator circuit is further improved by the temperature-independence of the bias current.

In another embodiment of the oscillator circuit, the current generation circuit is set up for trimming the current value of at least one current among the generated currents, i.e., the charge currents or the bias currents, as a function of respective trimming signals. In order to adapt the times for charging the capacitors, i.e., the time when the reference voltage is reached, the currents used can be modified by connecting respective controlled current sources. The currents generated in the current generation circuit can thus be increased as well as decreased. Thereby it is possible, for example, to compensate for inaccuracies of capacitance values for the capacitors due to production tolerances.

The flipflop is constructed in the oscillator circuit as an RS-flipflop, for example, which can be set and reset as a function of signals at the outputs of the first and second comparators. Such RS-flipflops can be realized in the familiar manner by means of cross-connected NAND gates, for example.

In one embodiment of the oscillator circuit, the comparison circuit can be switched into a standby state as a function of a standby signal. For example, quiescent currents in the comparison circuit or the comparators can be switched off as a function of the standby signal. Thereby energy can be saved in the oscillator circuit when no clock signal is required. However, other circuit parts of the oscillator circuit can also be switched into a standby state by the standby signal.

In one exemplary embodiment of a method for generating a clock signal, a first capacitor is charged with a first charging current and a second capacitor is charged with a second charging current, controlled in each case. As part of the controlling, a first voltage across the first capacitor is compared to a reference voltage. A second voltage is likewise compared to the reference voltage across the second capacitor. An output state of a flipflop is controlled as a function of the comparison results. A charging process of the first capacitor is started if the second voltage exceeds the reference voltage. Correspondingly, a charging process of the second capacitor is started if the first voltage exceeds the reference voltage. A discharge process of the first capacitor is started if the output state of the flipflop changes as a function of the comparison outcome resulting from the first voltage, and a discharge process of the second capacitor is started if the output state of the flipflop changes as a function of the comparison outcome resulting from the second voltage. The clock signal results from the output state of the flip-flop.

With the described method, the start of the charging process of the respective capacitors is independent of the output state of the flipflop. Possible temperature-dependent switching times from the point in time when the reference voltage is exceeded by the charge voltages until the changing-over of the flipflop's output state do not enter into the clock frequency of the generated clock signal. Consequently, a clock signal can be generated essentially temperature-independently with the described method.

In an embodiment, a first control signal is provided by means of comparing the first voltage across the first capacitor with the reference voltage. A second control signal is provided by means of comparing the second voltage across the second capacitor with the reference voltage.

In an embodiment, the output state of the flipflop is set as a function of the first and the second control signal.

In an embodiment, the charging process of the first capacitor is performed, if the second voltage exceeds the reference voltage. The charging process of the first capacitor is immediately triggered by the second control signal. The charging process of the second capacitor is performed, if the first voltage exceeds the reference voltage. The charging process of the second capacitor is immediately triggered by the first control signal.

This is supported in one embodiment of the method by generating the first and the second charging currents from a temperature-compensated reference current. The temperature-compensated reference current and the reference voltage are generated in a bandgap circuit, for example.

During a discharge process of one of the capacitors in one embodiment of the method, the respective associated charging current is diverted to a reference potential terminal. In other words, the first and second charging currents flow essentially constantly, independently of whether the first and the second capacitor are being charged or not. Therefore no current peaks appear on a supply voltage of the current-generating circuits during the changeover from a charging process to a discharging process and vice versa.

The various embodiments of the oscillator circuit are preferably realized as an integrated circuit on a semiconductor component.

BRIEF DESCRIPTION OF THE DRAWINGS

The invention will be described in detail below for exemplary embodiments with reference to the figures. Elements with identical function or effect bear identical reference numbers.

DETAILED DESCRIPTION OF THE DRAWINGS

Figure 1:
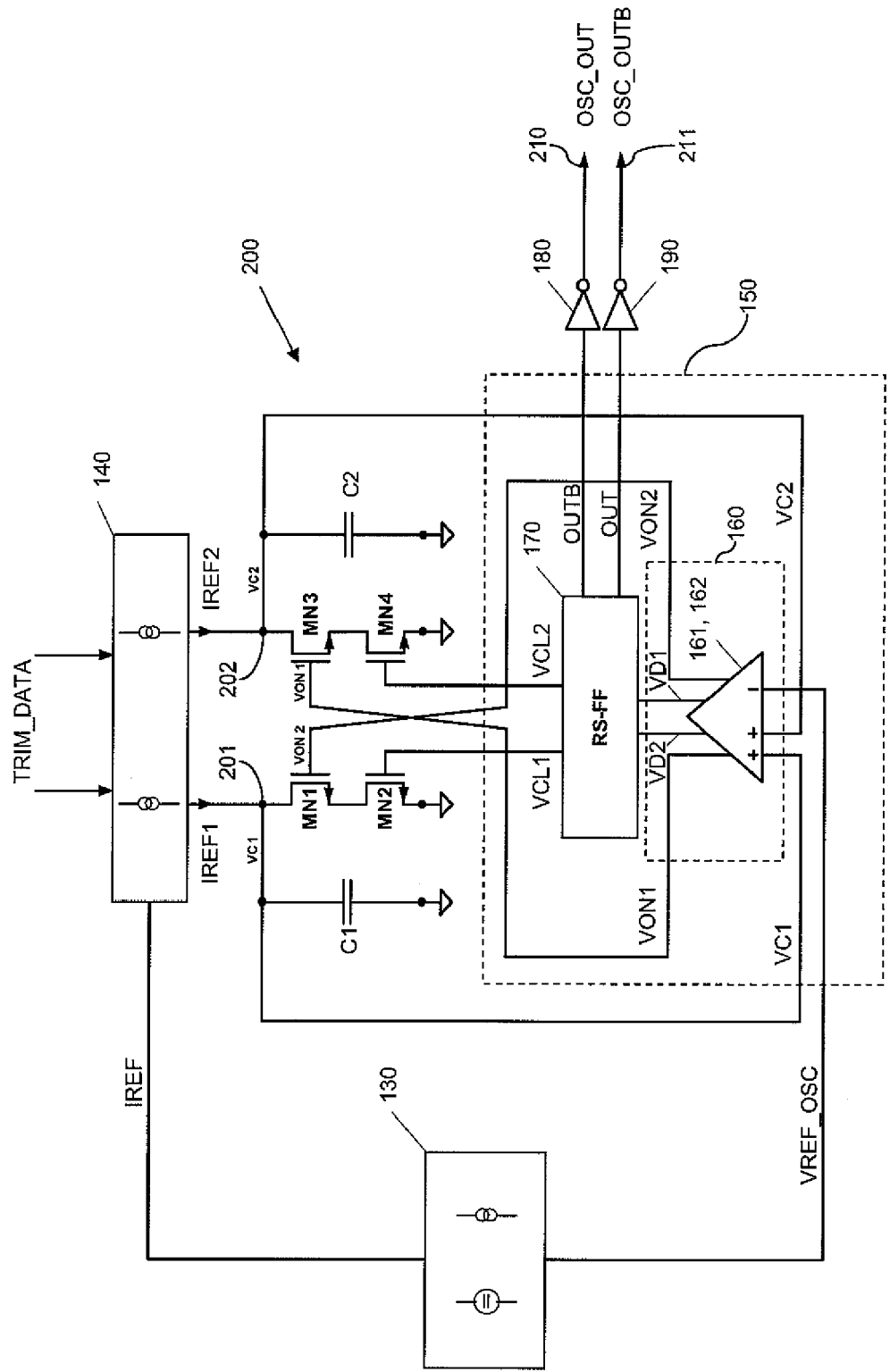
FIG. 1 shows an exemplary embodiment of an oscillator circuit.

FIG. 1 shows an exemplary embodiment of an oscillator circuit. It comprises a charging block 200 with a first terminal 201 and a second terminal 202. A first capacitor C1 is connected at one end to the first terminal 201 and at its other end to a reference potential terminal. A series circuit of a first and a second switch MN1, MN2, which likewise couples the first terminal 201 to the reference potential terminal, is provided parallel to the first capacitor C1. A second capacitor C2, which couples the second terminal 202 to the reference potential terminal, is connected to the second terminal 202. A series circuit of a third and a fourth switch MN3, MN4 is again provided parallel to the second capacitor C2. The first through fourth switches MN1, MN2, MN3, MN4 are implemented in this exemplary embodiment as n-channel field effect transistors. In principle, however, other types of switches can also be used.

The first and second terminals 201, 202 are connected to a current generation circuit 140 for supplying a first and a second charging current IREF1, IREF2. A comparison and logic block 150 has a comparison circuit 160 with a first and a second comparator 161, 162, as well as an RS-flipflop 170. The first and second comparators 161, 162 are shown for clarity as a common element, which has respective non-inverting inputs marked with a + and a common inverting input marked with a minus sign.

The non-inverting input of the first comparator 161 is connected to the first terminal 201 for feeding a charging voltage VC1, which corresponds to the voltage across the first capacitor C1. Accordingly, the second comparator 162 is connected at its non-inverting input to the second terminal 202, in order to supply a second charging voltage VC2, which corresponds to the voltage across the second capacitor C2. The common inverting input of the comparators 161, 162 is connected to a bandgap circuit 130 for supplying a reference voltage VREF_OSC. In addition, the current generation circuit 140 is connected to the bandgap circuit 130 to supply a reference current IREF to the current generation circuit. The current generation circuit 140 further comprises inputs for feeding trimming signals TRIM_DATA, which serve for trimming the current value inside the current generation circuit 140.

One output of the first comparator 161 is connected to a control terminal of the third switch MN3 to supply a corresponding control signal VON1. In the same manner, one output of the second comparator 162 is connected to a control terminal of the first switch MN1 to supply a corresponding control signal VON2. Control signals VD2, VD1, which are supplied to a set input and reset input of the flipflop 170, are also emitted at the outputs of the first and second comparators 161, 162. State outputs of the flip-flop 170 are connected to control terminals of the second and fourth switches MN2, MN4 to supply control signals VCL1, VCL2. State signals OUT, OUTB are emitted at additional state outputs of the flipflop 170 and are supplied via inverters 180, 190, which act as buffer circuits, to the oscillator output 210, 211, from where they are emitted as clock signals OSC_OUT, OSC_OUTB.

The mode of operation of the oscillator circuit shown in FIG. 1 will be explained in more detail below based on the signal diagrams in FIG. 2. The first and second capacitors C1, C2 are controlled with the first and second charging currents IREF1, IREF2. The first and second charging currents IREF1, IREF2 are derived in the current generation circuit 140 independently of one another from the reference current IREF, the reference current preferably being temperature-compensated.

The first and second charging currents IREF1, IREF2 respectively flow either into the first and second capacitors C1, C2 or into the series circuit of the switches MN1, MN2 or MN3, MN4, depending on the switching state of these switches. The capacitors C1, C2 preferably have the same capacitance value, whereby slight variations are possible due to production tolerances. In principle, different capacitance values are also possible, but this can lead to shifts in the duty cycle of the clock signal or to a change of the clock frequency.

Figure 2:
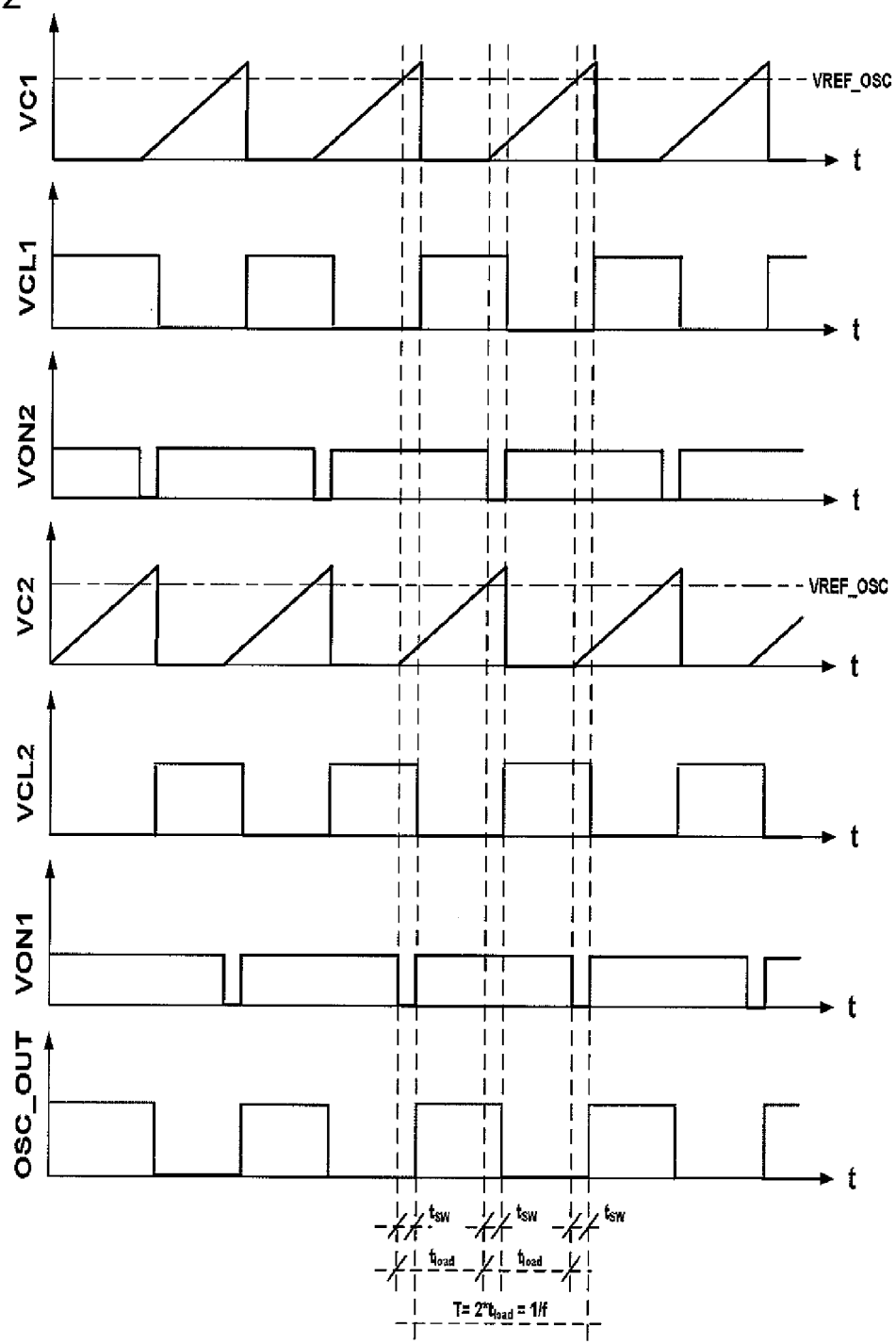
FIG. 2 shows a signal-time diagram of signals of the oscillator circuit.

With reference to FIG. 2, the output signal VON1 of the first comparator 161 changes from a high state to a low state at the point in time at which the first charging voltage VC1 exceeds the reference voltage VREF_OSC. Thereby the third switch MN3 is opened, so that the second charging current IREF2 flows into the second capacitor C2 and thus the charging process for the second capacitor C2 is started. At the same time the output signal VD2 of the first comparator 161, which is derived directly from the signal VON1, by pure level adjustment for example, triggers the flipflop 170 to a change of state, which corresponds to initiating a changeover process of the output states VCL1, VCL2 in the flipflop 170. Accordingly, the signal VCL1 changes after a switching time $t_{sw}$ from a low state to a high state and conversely the signal VCL2 changes from a high state to a low state. Since the output signal VON2 of the second comparator 162 also has a high state at this time, both the first and the second switches MN1, MN2 are closed. This leads on the one hand to the first charging current IREF1 flowing to the reference potential terminal via the switches MN1, MN2 and, on the other, to the first capacitor C1 being discharged via the switches MN1, MN2. With an appropriate dimensioning of the switches, the time for the discharging process is negligible.

As a consequence of the discharge of the first capacitor C1 and the accordingly dropped charging voltage VC1, the output signal VON1 of the first comparator 161 again changes into a high state, whereby the third switch MN3 is closed. Since the output signal VCL2 of the flipflop 170 opens the fourth switch MN4, however, the charging process of the second capacitor C2 is continued or is not interrupted.

If the second charging voltage VC2 exceeds the reference voltage VREF_OSC, the output signal VON2 of the second comparator 162 changes from a high state to a low state, whereby the first switch MN1 is opened. Thereby the first charging current IREF1 begins to flow into the first capacitor C1. In other words, the charging process of the first capacitor C1 is thereby started.

Analogously to that which was described above, the output signal VD1 of the second comparator 162, which is derived by level adjustment, for example, from the output signal VON2, triggers the flipflop 170 to a change of state. After the corresponding switching time $t_{sw}$, the level of the output signals VCL1, VCL2 is inverted. Consequently the third switch MN3 is closed by the signal VON1, and the fourth switch MN4 is closed by the signal VCL2, which leads to an outflow of the second charging current IREF2 via the switches MN3, MN4 and to the discharging of the second capacitor C2. Although thereafter the level of the output signal VON2 of the second comparator 162 again settles at a high state, and thereby the first switch MN1 is closed, the charging process of the first capacitor C1 is continued because of the open second switch MN2. Since the charging currents either flow into the capacitors C1, C2 or to the reference potential terminal via the switches MN1-MN4, voltage jumps on a supply voltage can be avoided.

The output signals OUT, OUTB of the flipflop 170 correspond in essence to the signals VCL1, VCL2, but are adapted with respect to their level. Buffered clock signals OSC_OUT, OSC_OUTB that are available for use in other circuit parts of an electronic circuit are generated by the inverters 180, 190.

A period duration T of the clock signal OSC_OUT results essentially from the charging times $t_{load}$ of the first and second capacitors C1, C2, according to the formula $T=2*t_{load}$. Since the charging phases of the capacitors C1, C2 are each started earlier by the length of the switching time $t_{sw}$, they do not enter into the calculation of the period duration T. With switching times $t_{sw}$ assumed to be equal for both comparators, the clock flanks of the clock signal OSC_OUT are shifted by the switching time $t_{sw}$ with respect to the beginning and end of the charging phrase. Since the switching times of the comparators 161, 162 and the flipflop 170 play no role in the output frequency of the oscillator circuit, the switching elements, in particular the comparators, can be slow and therefore designed for a low energy operation. Thus the above-described oscillator circuit also permits the construction of an energy-saving oscillator. The independence of the period duration T from the switching times $t_{sw}$ also enables a temperature-independent operation of the oscillator circuit. This is further supported by the low or nonexistent temperature dependence of the charging currents IREF1, IREF2 and the reference voltage VREF_OSC.

Due to the provision of mutually independent charging currents IREF1, IREF2, it is possible for the charging phases of the capacitors C1, C2 to overlap. In addition, the level of the charging currents IREF1, IREF2 can be adapted in case of deviations of the capacitors C1, C2 with respect to their capacitance value, so that the ratio between the first charging current and the capacitance value of the first capacitor C1 is equal to the ratio of the second charging current IREF2 to the capacitance value of the second capacitor C2. The current value trimming can be performed by trimming the first charging current IREF1, the second charging current IREF2 or both charging currents IREF1, IREF2. The necessary current value trimming can be determined, for example, in a calibration measurement during or after the production of the oscillator circuit, wherein the determined current value adjustments are stored in the form of trimming signals or trimming data. For example, a one-time programmable memory OTP, or an EPROM can be provided, which supplies the necessary trimming signals TRIM_DATA to the current generation unit 140 when the oscillator circuit is in operation.

Figure 3:
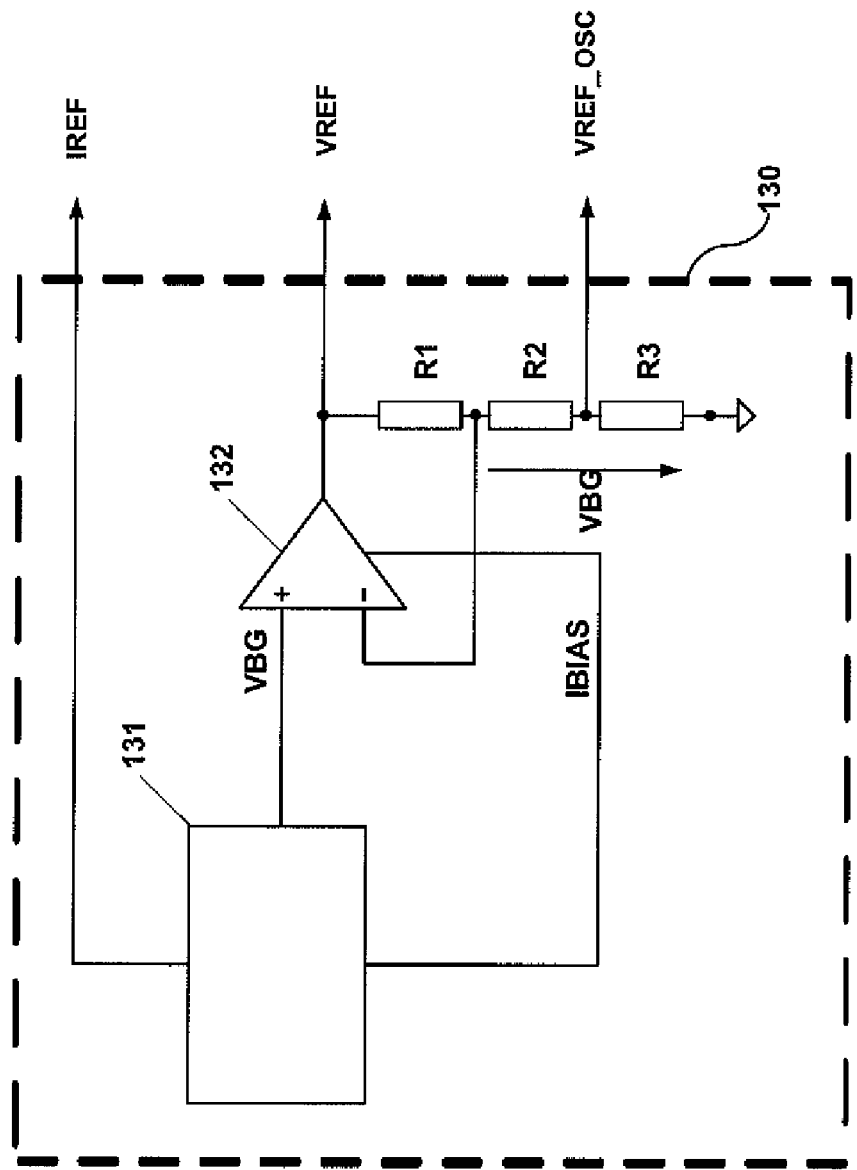
FIG. 3 shows an exemplary embodiment of a bandgap circuit.

FIG. 3 shows an exemplary embodiment of a bandgap circuit 130, which comprises a current and voltage generation block 131, an operational amplifier 132 and resistors R1, R2, R3. The circuit block 131 serves to generate a temperature-stable reference voltage VBG, which can also be referred to as a bandgap voltage, and a temperature-compensated reference current IREF. The bandgap voltage VBG is supplied to a non-inverting input of the operational amplifier 132. The output of the operational amplifier 132 is coupled to the reference potential terminal via a series circuit of the resistors R1, R2, R3, wherein a connection node R1, R2 of the resistors is connected to the inverting input of the operational amplifier 132. A bias current IBIAS for supplying the operational amplifier 132 is likewise provided by the circuit block 131 and is preferably temperature-compensated.

In the operation of the structure shown in FIG. 3, the bandgap voltage VBG settles in as the voltage drop across the resistors R2, R3. This has the effect that an additional reference voltage VREF, which can be used elsewhere in separate parts, is higher than the bandgap voltage VBG. The reference voltage VREF_OSC, which is smaller than the bandgap voltage due to the voltage divider of the resistors R2, R3, is tapped at the connecting node of the resistors R2, R3. Since the value range of the bandgap voltage VBG is technologically limited, shorter charging times and thus higher frequencies for the clock signal OSC_OUT can be generated by the smaller reference voltage VREF_OSC. Alternatively or additionally, smaller charging currents can be used to charge the capacitors, which reduces the power consumption of the oscillator circuit.

Figure 4:
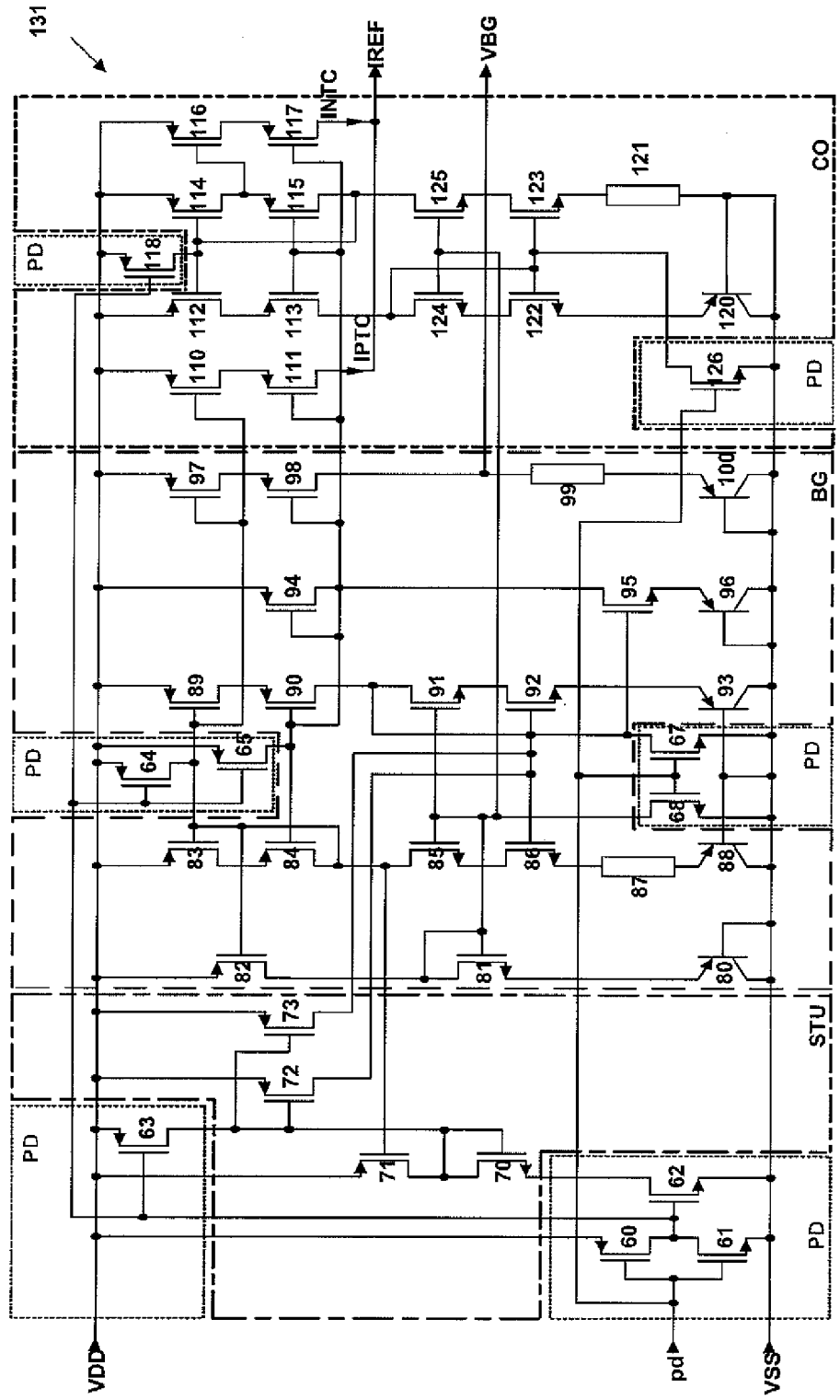
FIG. 4 shows an exemplary embodiment detail of the bandgap circuit.

FIG. 4 shows an exemplary embodiment of the circuit block 131 for generating the bandgap voltage VBG and the reference current IREF. The circuit block 131 comprises a voltage generation block BG with elements 80-100, a current generation block CO with elements 110-117 and 120-125, a start-up block STU with elements 70-73, and a block PD for controlling a standby state, with elements 60-68 and 118, 126.

In the block BG, the bandgap voltage VBG is generated, wherein a current that is proportional to the absolute temperature, a so-called PTAT current, is used for the generation. This current is generated in the present circuit, for example, by controlling the transistors 94, 95, 96, in the circuit of the transistors 97, 98, the resistor 99 and the transistor 100 connected as a resistor. The PTAT current is mirrored by the transistor 111 in the current generation block CO where it results as a current IPTC with a positive temperature coefficient. In the current generation block CO, a current INTC with a negative temperature coefficient, which can also be referred to as a CTAT current, is additionally generated by the elements 112-117 and 120-125. The components used here are dimensioned such that the temperature coefficients of the currents IPTC, INTC are of essentially the same magnitude and differ only in their sign. At the connection node of the transistors 111, 117, the currents IPTC and INTC are added together to form the temperature-compensated reference current IREF.

At the initial application of an operating voltage VDD, the voltage generation area BG is securely brought to a desired operating point by the start-up circuit STU.

Based on a standby signal pd, the illustrated circuit can be placed in a standby state or a power-saving mode with the circuit parts labelled PD.

Additional possible embodiments of bandgap circuits are generally known and can be used without adaptation in the described oscillator circuit of FIG. 1. It is merely necessary to take care that both the generated bandgap voltage VBG and the reference voltage VREF_OSC, as well as the reference current IREF, have a low and uniform temperature dependence, to the extent possible.

Figure 5:
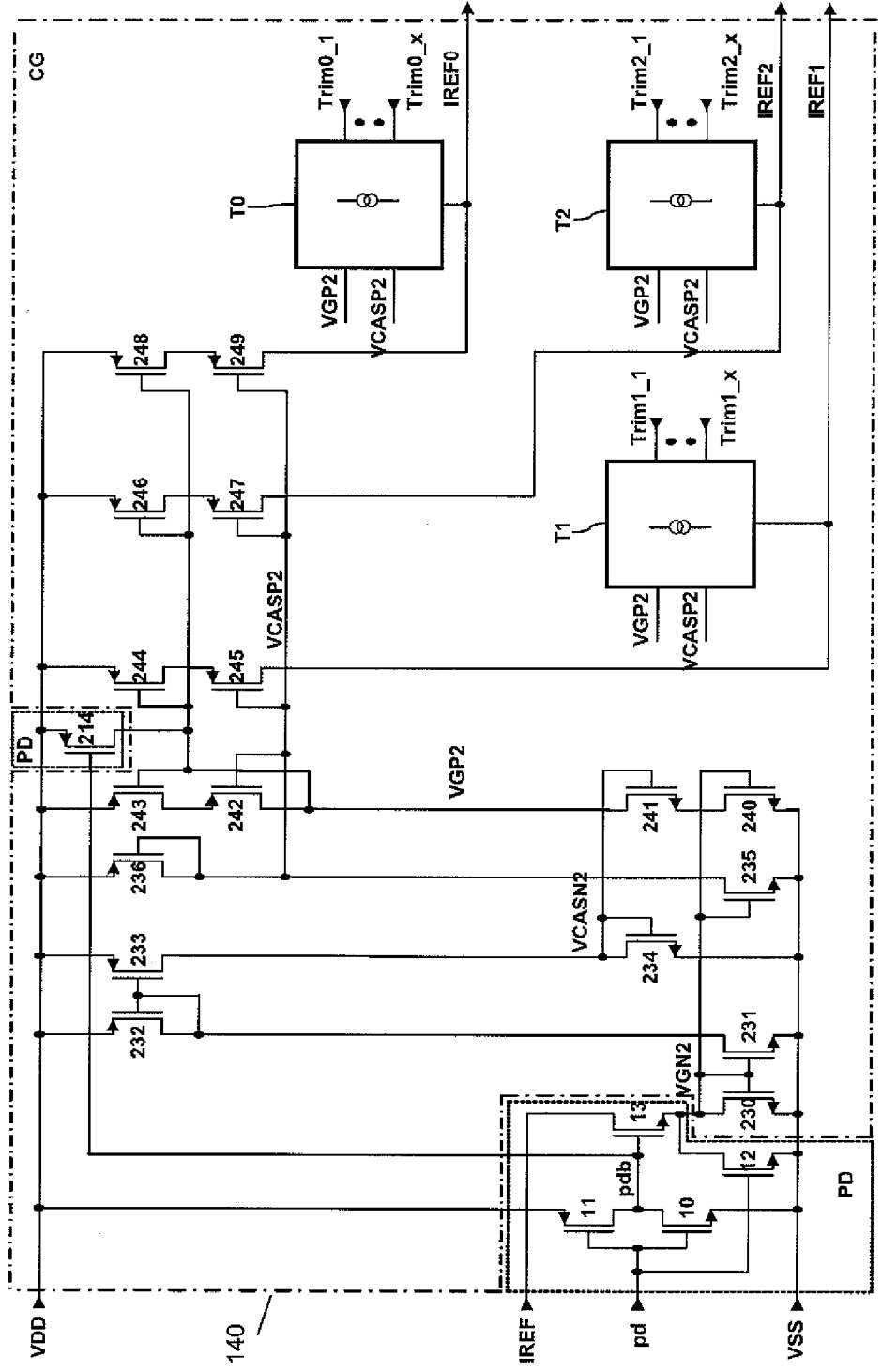
FIG. 5 shows an exemplary embodiment of a current generation circuit.

FIG. 5 shows an exemplary embodiment of a current generation circuit 140 with a current generation block CG and a circuit block PD for a standby state. The current generation block CG comprises transistors 230-236 and 240-249, as well as current-trimming circuits T1, T2, T0.

The current generation block CG is fed on the input side, by the reference current IREF, which generates a first cascode voltage VCASN2 via a current mirror 230, 231, an additional current mirror 232, 233 and the transistor 234. A control voltage VGN2, which together with the first cascade voltage VCASN2 generates a first control potential VGP2 via the transistors 235, 240, 241, 242, 243, also results at the control terminal of the current mirror 230, 231. In addition, a second cascode voltage VCASP2, which controls the transistors 245, 247, 249, is generated via the transistors 235, 236 from the first control potential VGP2 and the control voltage VGN2. The first control potential VGP2 additionally drives the transistors 244, 246, 248 jointly such that the reference current IREF ultimately is mirrored via the transistors 242, 243 onto the current paths of the transistors 244, 245, the transistors 246, 247 and the transistors 248, 249. In other words, the transistors 242-249 form a cascoded current mirror.

The trimming circuits T0, T1, T2, to which the signals VGP2 and VCASP2 are supplied on the input side, are connected to the current paths of the transistors 245-249. The trimming circuits T0, T1, T2 comprise, for example, respective controlled current sources which, as a function of trimming signals, emit a respective trimming current that modifies the first and second charging currents IREF1, IREF2, as well as a bias current IREF0. For this purpose, trimming signals TRIM1_1 through TRIM1_X are applied to the first trimming circuit, trimming signals TRIM2_1 through TRIM2_X are applied to the second trimming circuit T2, and trimming signals TRIM0_1 through TRIM0_X are applied to the third trimming circuit T0. The aforementioned trimming signals are a part of the trimming signals TRIM_DATA illustrated in FIG. 1 or constitute these signals. By means of the trimming signals, for example, linearly or binarily weighted current sources can be switched on or off in the trimming circuits T0, T1, T2, in order thereby to generate an additional defined current that is added to the mirrored currents or subtracted from them.

By means of the circuit block PD, the current generation block CG can be switched to be essentially de-energized based on the standby signal pd and the standby signal pdb generated by the inverter 10, 11.

Figure 6:
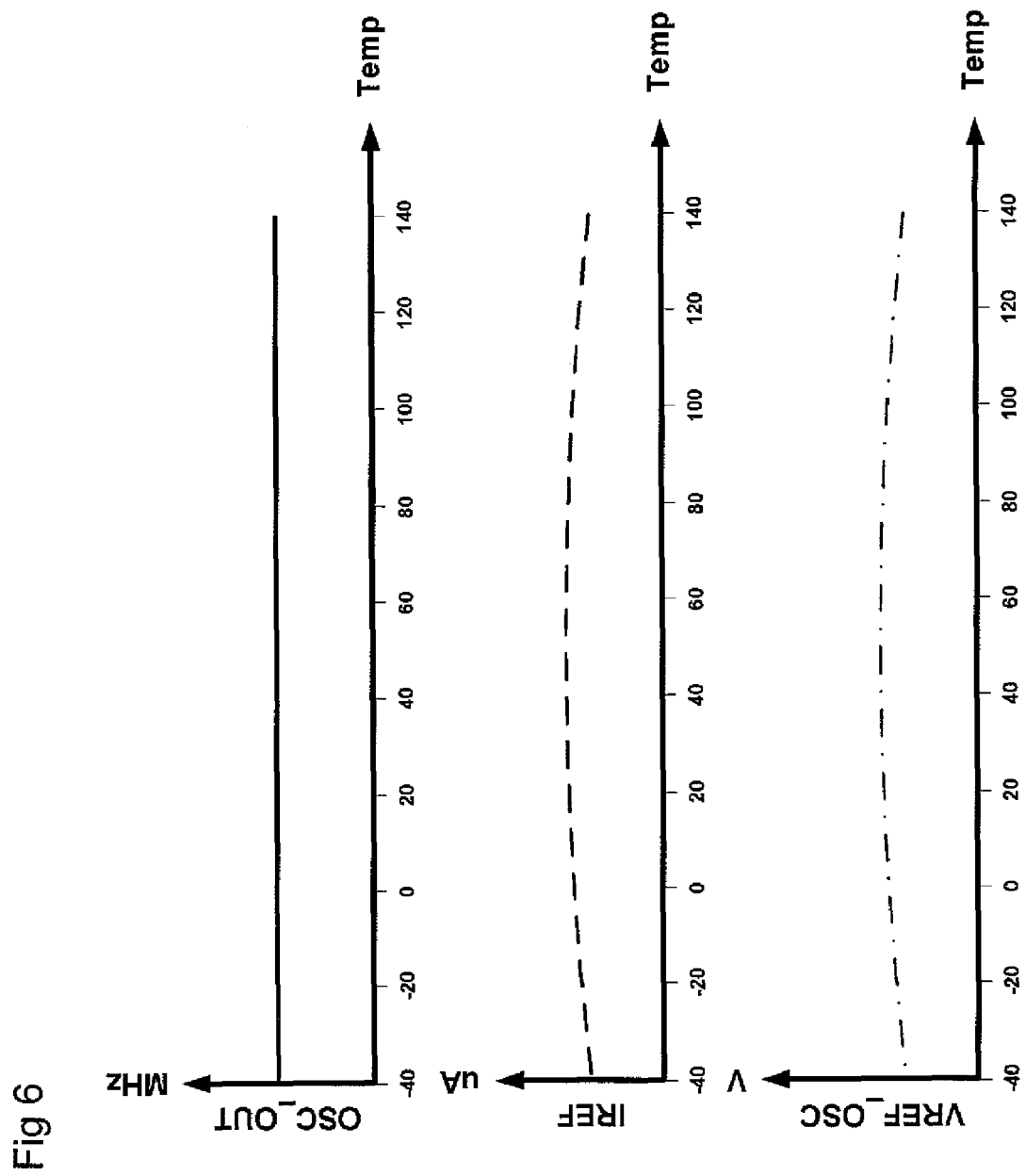
FIG. 6 shows diagrams of the temperature dependence of signals in the oscillator circuit.

FIG. 6 shows signal diagrams of the reference voltage, VREF_OSC, the reference current IREF and the frequency of the output signal OSC_OUT as a function of the operating temperature or the ambient temperature. For example, the reference voltage VREF_OSC and the reference current IREF are temperature-dependent only to a first approximation. But since the current and the voltage have an influence on the charging time of the capacitors C1, C2 to an equal extent, their visibly similar temperature behaviors cancel one another out so that the output frequency of the clock signal is substantially temperature-independent.

Figure 7:
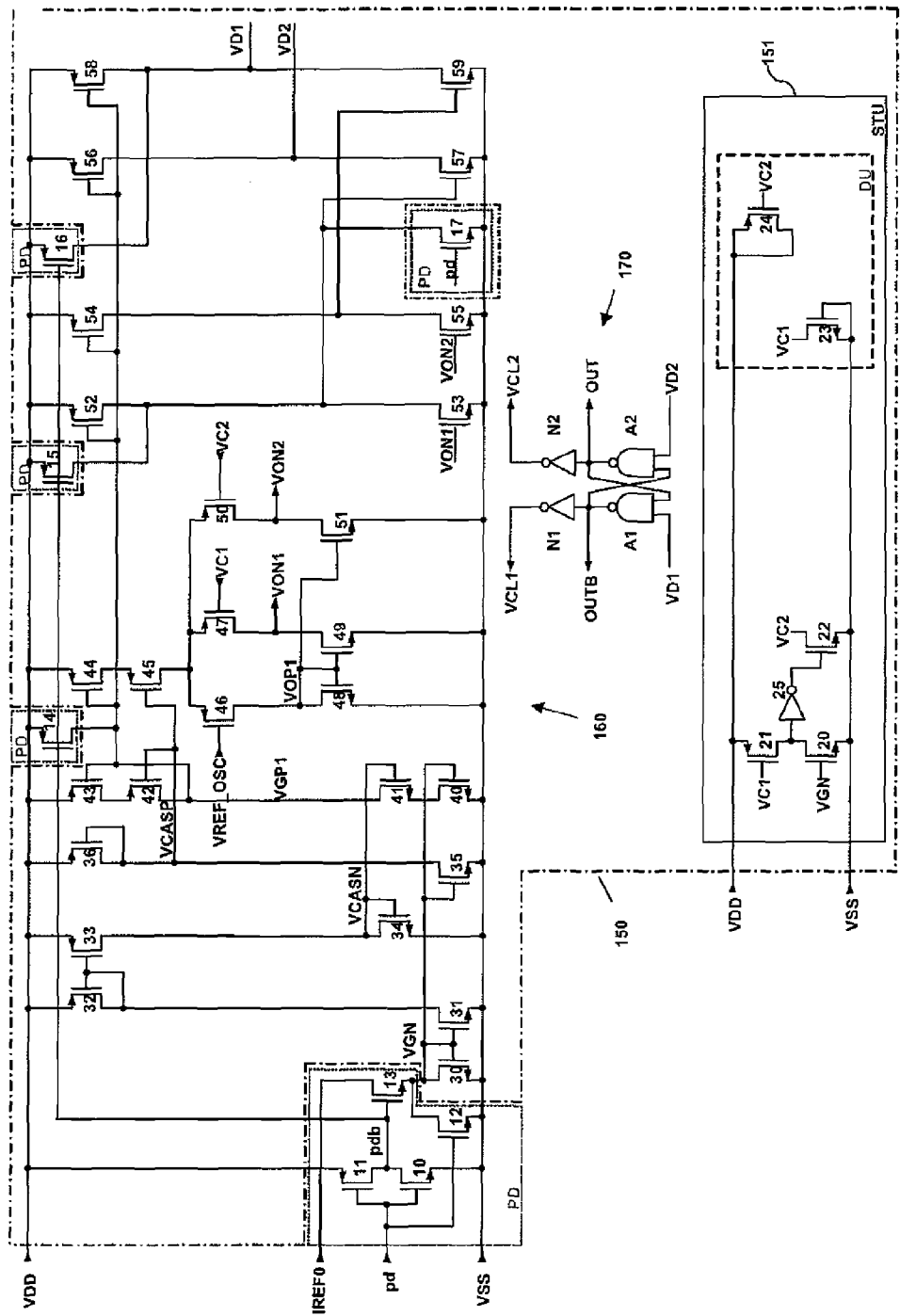
FIG. 7 shows an embodiment detail of the oscillator circuit with comparison circuit and flip-flop.

FIG. 7 shows a possible embodiment of a comparison and logic block 150 of the oscillator circuit from FIG. 1 with a comparison circuit 160, a flipflop 170 and a circuit block STU for a circuit start-up. Again, circuit parts PD are provided for a standby state of the oscillator circuit.

The comparison circuit 160 comprises transistors 30-36 and 40-45 which, similarly to that which was described above for the exemplary embodiment of FIG. 5, convert the bias current IREF0 into control potentials VGN, VGP1 and cascode voltages VCASN, VCASP. The transistors 46-51 form a differential stage together with the first and second comparators, which are supplied via the current from the transistors 44, 45 as an operating current. Since this current is derived from the temperature-compensated bias current IREF0 by transistors 44, 45 by means of multiple mirroring, the first and second comparators have a substantially temperature-independent switching behavior. The control terminal of the transistor 46 forms the inverting input of the comparators, at which the reference voltage VREF_OSC is supplied. The charging voltages VC1, VC2 of the first and second capacitors are supplied to the comparison circuit 160 at the control terminals of the transistors 47 or 50. The output signals VON1, VON 2 of the comparators are tapped at the transistors 47, 50. Thus the control signals VON1, VON2 for the first and third switches MN1, MN3 are directly coupled out of the differential stage. The high level of VON1 and VON2 in this case is a few 100 mV above the threshold voltage of the transistors 49, 51. Depending on its construction, a conventional digital gate would not respond in some cases to a high level of this type. However, since this level is sufficient for driving the transistors MN1, MN3 or the transistors 53, 55, one could speak of an analog high level in contrast to a digital high level.

The signals VD1, VD2 that serve to trigger the flipflop 170 are generated via the transistors 52-59 from the output signals VON1, VON2 of the comparators. For this purpose, the transistors 52, 54, 56, 58 are driven with the control potential VGP1, which is also present at the transistor 44 for supplying the comparators. The signals VON1, VON2 control the transistors 53 and 55 respectively, whose output signals produce the signals VD1, VD2 via the transistors 57, 59. The signals VD1, VD2 thus have the same logical state as the signals VON1, VON2, with VD2 depending on VON1 and VD1 depending on VON2.

The comparison circuit 160 can be essentially completely de-energized via the circuit parts PD.

The flipflop 170 is realized in the familiar manner by means of two NAND gates, for each of which one input is controlled by one of the signals VD1, VD2 and the other input is connected to the output of the respective other NAND gate. In the present exemplary embodiment, the clock signals OUT, OUTB are emitted at the outputs of the NAND gates A1, A2. The signals VCL1, VCL2 are generated from these signals via inverters N1, N2.

In order for the oscillator circuit to reliably start and be able to emit a desired clock signal, it is helpful if defined states at the start-up of the circuit can be specified, so as to prevent both comparator inputs from being supplied with an identical signal and thus preventing the circuit from being able to resonate. This is guaranteed by the transistors 20-25 in the circuit block 151. The transistors 23, 24 in block DU serve as dummy element.

The circuits shown in FIGS. 4, 5 and 7 merely represent possible embodiments of the necessary modules in the arrangement from FIG. 1. Possible variations follow from the associated description.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

I claim:

1. An oscillator circuit, comprising:
a charging block with a first terminal for feeding a first charging current, to which terminal a first capacitor and a series circuit of a first and a second switch are connected, and with a second terminal for feeding a second charging current, to which terminal a second capacitor and a series circuit of a third and a fourth switch are connected;
a comparison circuit with a first comparator which is configured to compare a first voltage at the first terminal to a reference voltage and whose output is connected to a control terminal of the third switch, and with a second comparator which is configured to compare a second voltage at the second terminal to the reference voltage and whose output is connected to a control terminal of the first switch; and a flipflop which is coupled on the input side to the outputs of the first and the second comparator, and on the output side, to control terminals of the second and the fourth switch, as well as to an oscillator output.

2. The oscillator circuit according to claim 1, further comprising a current generation circuit which is configured to generate the first and the second charging currents from a temperature-compensated reference current.

3. The oscillator circuit according to claim 2, further comprising a bandgap circuit that is configured to generate the reference voltage and to generate the temperature-compensated reference current.

4. The oscillator circuit according to claim 3, wherein the bandgap circuit is configured to generate a bandgap voltage by means of a current with a positive temperature coefficient and to generate the temperature-compensated reference current by means of the current having the positive temperature coefficient and a current with a negative temperature coefficient.

5. The oscillator circuit according to claim 4, wherein the bandgap circuit is configured to generate the reference voltage with a value smaller than the bandgap voltage.

6. The oscillator circuit according to claim 2, wherein the current generation circuit is further configured to generate a bias current from the temperature-compensated reference current, the bias current being provided for use in the comparison circuit.

7. The oscillator circuit according to claim 2, wherein the current generation circuit is configured to trim the current value of at least one current among the generated currents out of a group comprising a bias current, the first charging current, and the second charging current as a function of respective trimming signals.

8. The oscillator circuit according to claim 1, wherein the first capacitor and the series circuit of the first and the second switch are connected in parallel and in which the second capacitor and the series connection of the third and the fourth switch are connected in parallel.

9. The oscillator circuit according to claim 1, wherein the flipflop is configured as an RS flipflop which is settable or re-settable as a function of output signals at the outputs of the first and the second comparator.

10. The oscillator circuit according to claim 1, wherein the comparison circuit can be switched into a standby state as a function of a standby signal.

11. A method for generating a clock signal, wherein a first capacitor is charged with a first charging current and a second capacitor is charged with a second charging current, each in a controlled manner, the controlling comprising:

generating a first control signal by comparing a first voltage across the first capacitor to a reference voltage;

generating a second control signal by comparing a second voltage across the second capacitor to the reference voltage;

controlling an output state of a flipflop as a function of the first and second control signals; starting a charging process of the first capacitor if the second voltage exceeds the reference voltage, wherein the start of said charging process is immediately triggered by the second control signal;

starting a charging process of the second capacitor if the first voltage exceeds the reference voltage, wherein the start of said charging process is immediately triggered by the first control signal;

starting a discharging process of the first capacitor if the output state of the flip-flop changes as a function of the comparison outcome resulting from the first voltage; and starting a discharging process of the second capacitor if the output state of the flip-flop changes as a function of the comparison outcome resulting from the second voltage; wherein the clock signal results from the output state of the flip-flop.

12. The method according to claim 11, wherein the first and the second charging current are generated from a temperature-compensated reference current.

13. The method according to claim 12, wherein the temperature-compensated reference current and the reference voltage are generated by means of a bandgap circuit.

14. The method according to claim 11, wherein at least one current of a group comprising the first and the second charging current is adjusted as a function of respective trimming signals with respect to their current values.

15. The method according to claim 11, wherein, during a discharging process of at least one capacitor of a group comprising the first and the second capacitor, the first and second charging currents are respectively is diverted to a reference potential terminal.

* * * * *